United States Patent
Yang et al.

(10) Patent No.: US 11,215,658 B2
(45) Date of Patent: Jan. 4, 2022

(54) METHOD FOR POSITIONING SHORT CIRCUIT FAILURE

(71) Applicant: Shanghai Huali Integrated Circuit Mfg. Co., Ltd., Shanghai (CN)

(72) Inventors: Lingye Yang, Shanghai (CN); Hai'an Liu, Shanghai (CN)

(73) Assignee: Shanghai Huali Integrated Circuit Mfg. Co. Ltd, Shanghai (CN)

( * ) Notice: Subject to any disclaimer, the term of this patent is extended or adjusted under 35 U.S.C. 154(b) by 148 days.

(21) Appl. No.: 16/680,516

(22) Filed: Nov. 12, 2019

(65) Prior Publication Data
US 2020/0191861 A1    Jun. 18, 2020

(30) Foreign Application Priority Data
Dec. 12, 2018 (CN) .......................... 201811520660.7

(51) Int. Cl.
*G01R 31/28* (2006.01)
*G01R 27/14* (2006.01)
*H01L 21/67* (2006.01)
*H01L 21/66* (2006.01)

(52) U.S. Cl.
CPC ............ *G01R 31/28* (2013.01); *G01R 27/14* (2013.01); *H01L 21/67288* (2013.01); *H01L 22/30* (2013.01)

(58) Field of Classification Search
CPC ........................ G01R 31/28; G01R 31/2812; G01R 31/2853; G01R 31/2884; G01R 31/307; G01N 21/66; G01N 21/956; G01N 21/9501; H01L 21/956; H01L 21/67288; H01L 22/30; H01L 22/34

USPC .................. 324/713, 691, 649, 600
See application file for complete search history.

(56) References Cited

U.S. PATENT DOCUMENTS

| | | | | |
|---|---|---|---|---|
| 5,495,372 A * | 2/1996 | Bahlmann | ................. | H02P 6/34 360/75 |
| 6,636,064 B1 * | 10/2003 | Satya | ..................... | G01N 21/66 324/750.3 |
| 7,592,827 B1 * | 9/2009 | Brozek | ............. | G01R 31/2853 324/762.01 |

(Continued)

*Primary Examiner* — Giovanni Astacio-Oquendo
(74) *Attorney, Agent, or Firm* — Adsero IP

(57) ABSTRACT

The present invention provides a method for positioning short circuit failure, used to position the short circuit point between a first metal wire and a second metal wire. The positioning method comprises: measuring the resistance between the first metal wire and the second metal wire, and positioning the first region where the short circuit point is located by a resistance ratio. In the first region, the short circuit point may be gradually approached by periodically cutting the first metal wire and the second metal wire, electrically isolating the cut portions, and performing a plurality of voltage contrast analysis on the first metal wire and the second metal wire based on the principle of the dichotomy, thereby accurately locating the short circuit point. With the positioning method provided by the present invention, the region where the short circuit defect of the nA (nano ampere) level is located may be accurately found from the first metal wire and the second metal wire that are extremely long. The present invention contributes to improving the yield of a semiconductor device based on the defect adjustment process.

20 Claims, 18 Drawing Sheets

(56) References Cited

U.S. PATENT DOCUMENTS

| | | | |
|---|---|---|---|
| 7,969,564 B2 * | 6/2011 | Almogy | G01N 21/956 |
| | | | 356/237.2 |
| 11,125,804 B2 * | 9/2021 | Yang | G01R 31/2644 |
| 2006/0065645 A1 * | 3/2006 | Nakasu | B23K 26/32 |
| | | | 219/121.68 |

* cited by examiner

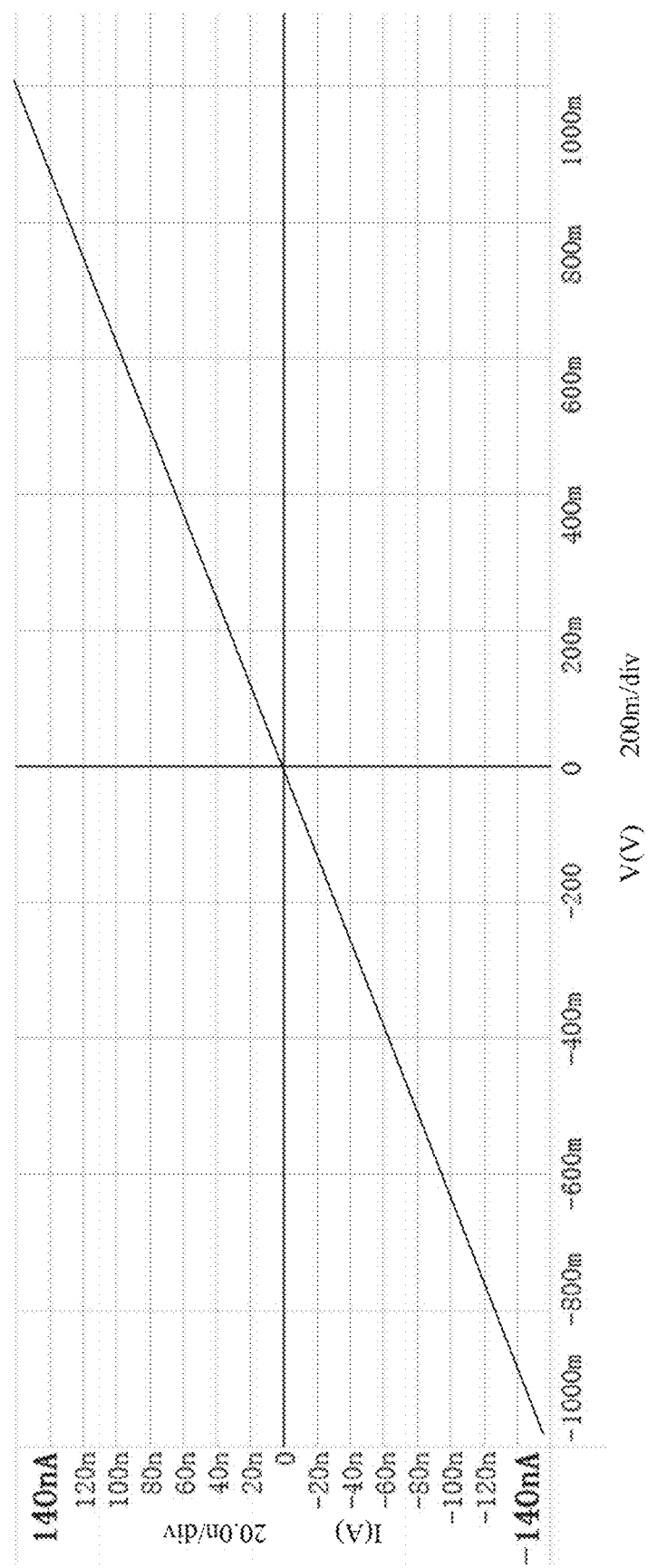
Prior Art  FIG.3A

METHOD FOR POSITIONING SHORT CIRCUIT FAILURE

CROSS-REFERENCE TO RELATED APPLICATIONS

The present application claims priority to Chinese Patent Application No. 201811520660.7, filed on Dec. 12, 2018, entitled "A METHOD FOR POSITIONING SHORT CIRCUIT FAILURE", which is incorporated by reference herein for all purposes.

FIELD

The present invention relates to the field of semiconductor process failure analysis, in particular to a positioning analysis method for metal short circuit failure.

BACKGROUND

In the mass production of semiconductor devices, by performing failure analysis (FA) on the designed and fabricated semiconductor devices, defects can be found and corrected to solve the problem caused by the defects. Therefore, failure analysis of semiconductor devices is very important for improving yield, improving reliability and stability of the process technology.

In the semiconductor process, it may be divided into previous devices and latter metal interconnect layers. The previous devices are taken out by the latter metal interconnect layers for work or electrical testing. With the increasing integration of the integrated circuits, metal interconnects are becoming thinner and narrower. However, due to process problems or design problems, the short circuit failure of the latter metal often occurs, which is an important cause of the integrated circuit failure. Therefore, it is necessary to find the root cause of failure through professional failure analysis.

The conventional failure analysis process comprises electrical confirmation, failure positioning and physical analysis to find the root cause of failure, wherein failure positioning is a very critical step. However, trying to find a nano-sized failure position on a 10 mm×5 mm chip is as hardly as positioning a building on the earth, the complexity and difficulty of which is known.

Finding the failure point by failure positioning technology is extremely important in the analysis of semiconductor chips, and it is also extremely challenging and difficult. Currently, the failure positioning methods commonly used in the semiconductor industry include photon emission microscopy (EMMI), optical resistance change microscope (OBIRCH) and thermal emission microscopy (Thermal), etc. However, as the semiconductor process technology is increasingly advanced, the stability of the latter process is also increasingly strong, and the leakage of metal short circuit failure samples becomes very small. The failure position is thereby impossible to be accurately determined by using conventional positioning analysis methods.

According to the working principle of conventional EMMI, the positioned defects are generally defects of the previous devices, and the short circuit defects of the latter metal interconnect layers are difficult to position.

According to the working principle of the conventional OBIRCH, the short circuit defects of the latter metal interconnect layers can be positioned. However, a long hot spot containing the short circuit position is often emphasized instead of only highlighting the short circuit position.

According to the working principle of the conventional Thermal, the previous defects and the latter defects can be both positioned, while the heat released from the leakage position is required reaching several tens or even hundreds of mW, and the short circuit with nA (nano ampere) level leakage is not be positioned.

Therefore, a positioning method that can effectively position the metal short circuit with nA level leakage accurately is required, thereby helping to analyze the cause of the defects, and timely adjusting the semiconductor process to improve the yield of semiconductor devices.

SUMMARY

A brief overview of one or more aspects is provided below to provide a basic understanding of these aspects. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

In order to accurately position the metal short circuit with nA level leakage, the present invention provides a method for positioning short circuit failure, used to position the short circuit point between a first metal wire and a second metal wire. The first metal wire circuitously extends in a first direction, comprising ⊓ shape parts arranged in the first direction. The second metal wire comprises fingers arranged in the first direction, corresponding to the ⊓ shape parts, wherein each finger is interspersed in the corresponding ⊓ shape part. The positioning method comprises:

grounding the first metal wire, floating the second metal wire, measuring a resistance between the first metal wire and the second metal wire, and positioning the first region where the short circuit point is located by a resistance ratio, wherein the first region comprises a plurality of the ⊓ shape parts of the first metal wire;

separating a plurality of corresponding fingers in the first region from the second metal wire to electrically isolate the fingers from each other;

performing a voltage contrast analysis on the first metal wire and the plurality of fingers of the second metal wire, and positioning a ⊓ shape part where the short circuit point is located from the plurality of ⊓ shape parts based on the obtained voltage contrast image;

cutting the ⊓ shape part where the short circuit point is located to electrically isolate the two sides of the ⊓ shape part;

performing a voltage contrast analysis on the two sides and the finger sandwiched therebetween, and positioning a defect side where the short circuit point is located based on the obtained voltage contrast image; and performing a plurality of voltage contrast analysis on the defect side based on dichotomy, and positioning the defect where the short circuit point is located based on the obtained voltage contrast image.

Optionally, the step of positioning the ⊓ shape part where the short circuit point is located further comprises:

grounding the first metal wire, floating the plurality of fingers of the second metal wire, performing a voltage contrast analysis; and obtaining a voltage contrast image of the first metal wire and the plurality of fingers, wherein the voltage contrast of the finger corresponding to the ⊓ shape part having the short circuit point is different from the voltage contrast of the remaining fingers.

Optionally, the second metal wire circuitously extends in the first direction, and the fingers are in shape of ⊓.

Optionally, positioning the defect side where the short circuit point is located further comprises: grounding the finger, floating the two sides, performing a voltage contrast analysis; and obtaining a voltage contrast image of the two sides and the finger sandwiched therebetween, wherein the defect side has the same voltage contrast as the finger.

Optionally, the step of cutting the ⊓ shape part where the short circuit point is located further comprises: cutting the finger sandwiched by the ⊓ shape part where the short circuit point is located to electrically isolate the two lateral parts of the finger;

positioning the defect side where the short circuit point is located further comprises: grounding the two sides, floating the two lateral parts of the finger, performing a voltage contrast analysis; and obtaining a voltage contrast image of the two sides and the two lateral parts of the finger, wherein one of the two lateral parts of the finger adjacent to the defect side has the same voltage contrast as the two sides.

Optionally, the second metal wire is comb-shaped in the first direction, comprising a handle extending in a first direction, wherein the handle connects the ends of the fingers, and the fingers are linear.

Optionally, performing a voltage contrast analysis on the two sides and the finger sandwiched therebetween further comprises: grounding any one metal segment of the two sides and the finger sandwiched therebetween, floating the other two metal segments and obtaining a voltage contrast image of the two sides and the finger sandwiched therebetween, wherein the short circuit point is located between two adjacent metal segments having same voltage contrast.

Optionally, performing a plurality of voltage contrast analysis on the defect side based on dichotomy further comprises:

successively cutting the defect side and the defect segment of the second metal wire short circuited to the defect side by equal division to gradually reduce the region where the short circuit point is located; and after each equal division, grounding one of the defect side and the defect segment of the second metal wire, floating the other, and obtaining the voltage contrast image of the two groups of metal wires after equal division, wherein the first metal wire and the second metal wire in the group of metal wires in which the short circuit point is located have same voltage contrast.

Optionally, the step of positioning the first region further comprises:

respectively measuring the resistance X between the first end of the first metal wire and the second end of the first metal wire, the resistance Y between the first end of the first metal wire and the first end of the second metal wire, and the resistance Z between the second end of the first metal wire and the second end of the second metal wire; and according to the resistance X, the resistance Y and the resistance Z, calculating the resistance ratio of the resistance between the short circuit point and the first end of the first metal wire, and the resistance between the short circuit point and the second end of the first metal wire to position the first region.

Optionally, the width of the first region corresponding to the plurality of ⊓ shape parts in the first region is ranged in 15-20 um; and/or the defect where the short circuit point is located is positioned in an area of 0.1 um×5 um based on dichotomy.

According to the method for positioning short circuit failure provided by the present invention, combined with the resistance ratio and the dichotomy method, the voltage contrast analysis is used to gradually reduce the region of the short circuit, thereby accurately positioning the short circuit point.

BRIEF DESCRIPTION OF THE DRAWINGS

FIG. 3A shows the test electrical data made on a test piece by the prior art;

DETAILED DESCRIPTION OF EMBODIMENTS

Embodiments of the present invention are described below by specific embodiments. Other advantages and utilities of the present invention will be readily apparent to those skilled in the art from this disclosure. Although the description of the present invention will be described in conjunction with the preferred embodiments, this is not a limitation of the invention. Conversely, the invention is described in conjunction with the embodiments so as to cover other alternatives or modifications that are possible in the embodiments of the invention. In order to provide a thorough understanding of the present invention, many specific details are included in the following description. The invention may also be practiced without these details. In addition, some specific details are omitted in the description in order to avoid obscuring the present invention.

Note that in the case of use, the signs left, right, front, back, top, bottom, forward, reverse, clockwise and counter clockwise are used for convenience purposes only and do not imply any specific fixed direction. In fact, they are used to reflect the relative position and/or orientation between the various parts of the object.

Understandably, although the terms "first", "second", "third", etc. may be used to describe various parts, regions, layers and/or portions to distinguish different parts, regions, layers and/or portions, the order of these parts, regions, layers and/or portions described above should not be limited by the terms. Therefore, a first part, region, layer and/or portion mentioned below may be also mentioned as a second part, region, layer and/or portion without departing from some embodiments of the present invention.

Although the method is illustrated and described as a series of actions for the purpose of simplifying the explanation, it should be understood and appreciated that these methods are not limited by the order of the actions. Those skilled in the art may understand that some actions may occur in different orders and/or concurrently with other actions that are illustrated and described herein or that are not illustrated and described herein, in accordance with one or more embodiments.

Figure 1:
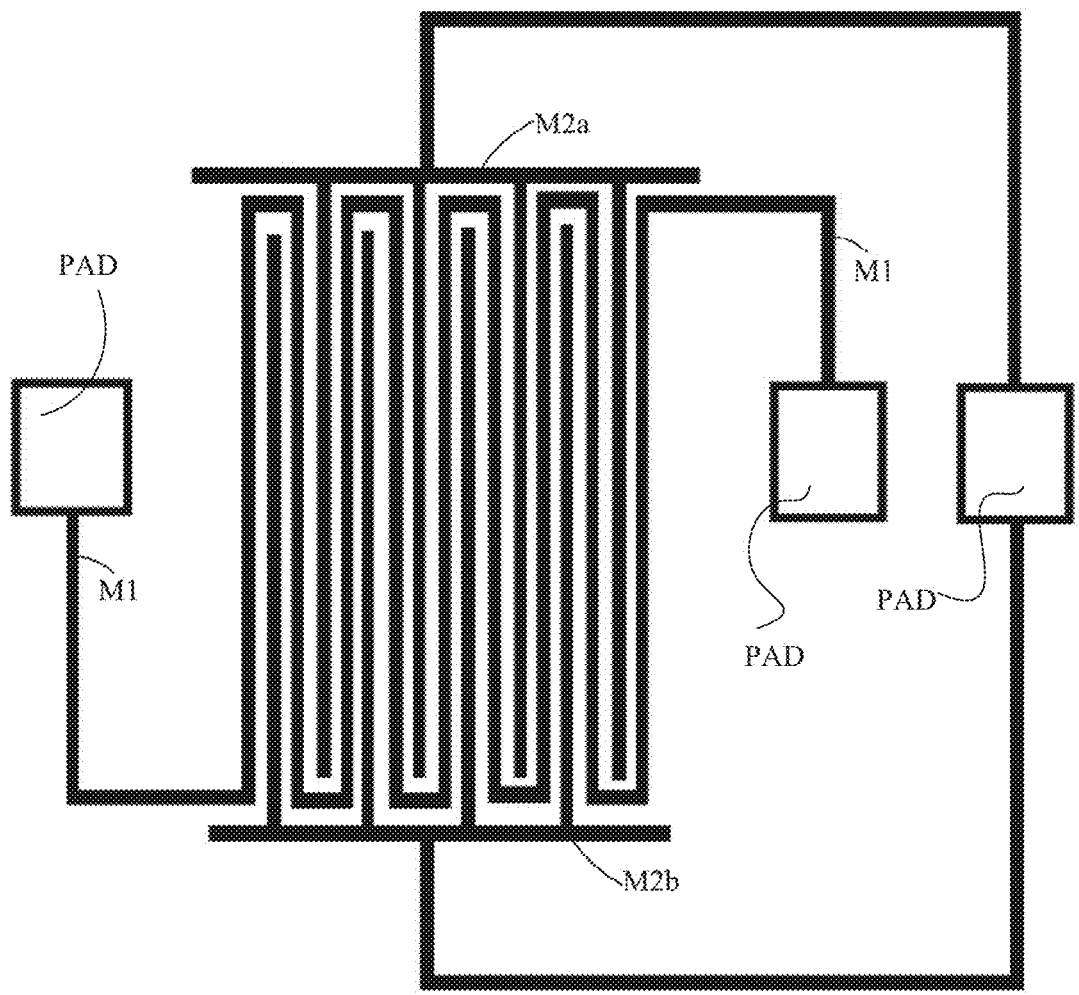
FIG. 1 shows the structure diagram of a test piece.
Figure 2:
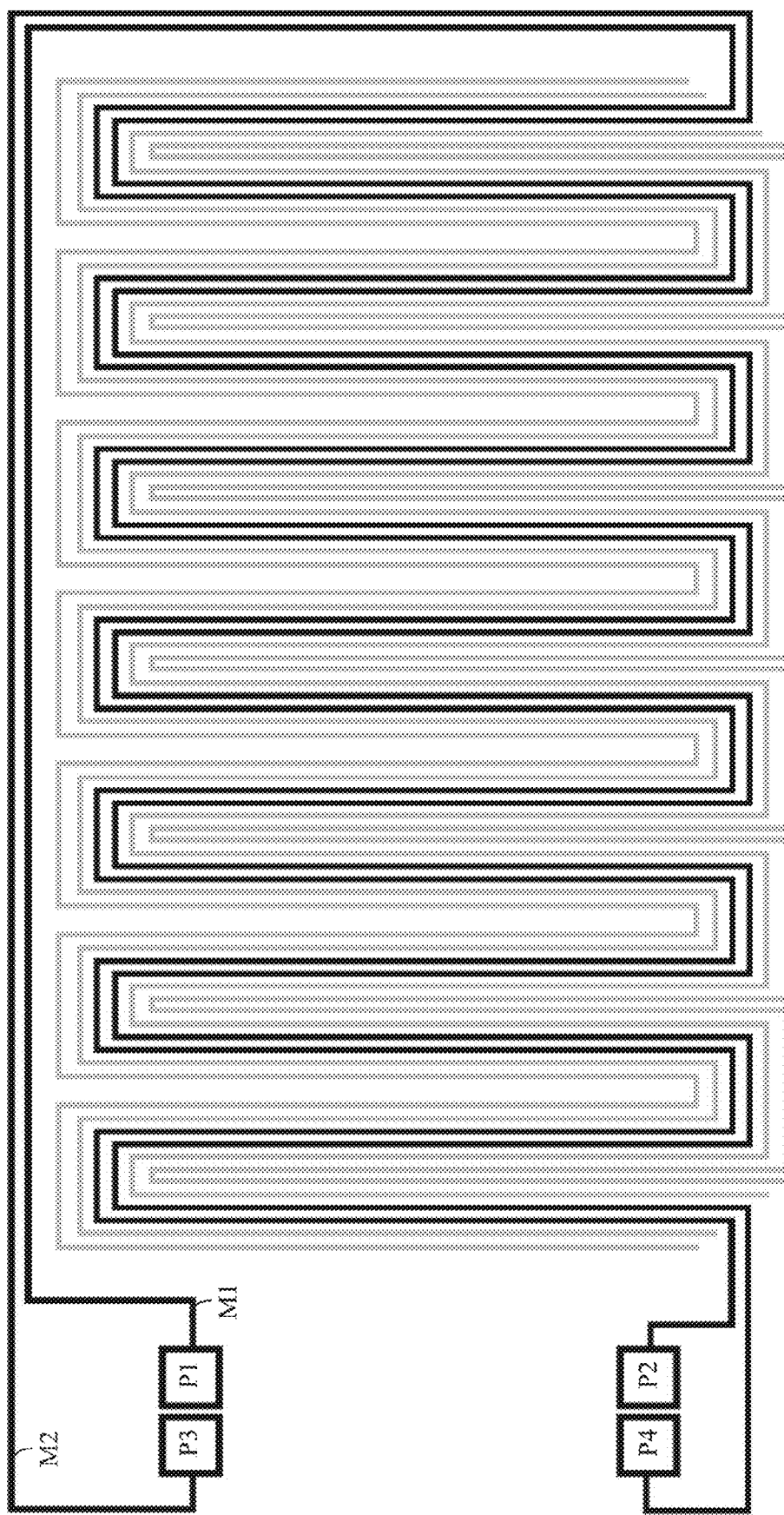
FIG. 2 shows the structure diagram of another test piece.

As described above, in order to monitor the semiconductor process, different test pieces are typically designed to simulate the formation of semiconductor devices. In order to discover process defects that may exist in the semiconductor process with greater probability, the shape of the test piece is usually designed with maximum redundancy. Referring to FIGS. 1 and 2, FIG. 1 shows a test piece comprising a combination of serpentine structures and comb structures, and FIG. 2 shows a test piece comprising a plurality of serpentine structures.

The test piece comprising a combination of serpentine structures and comb structures shown in FIG. 1 comprises a serpentine wire M1 circuitously extending in a first direction and at least one comb wire M2 interspersed in the serpentine wire M1. FIG. 1 shows two comb wire structures, comprising an upper comb wire M2a and a lower comb wire M2b. Those skilled in the art may appreciate that the number and location of the comb wires described above are merely illustrative but not limiting.

As shown in FIG. 1, the serpentine wire M1 comprises ⊥ shape parts arranged in the first direction. The comb wires M2 comprises fingers linearly arranged in the first direction. The ends of fingers in the upper comb wire M2a are connected by an upper handle, and the ends of fingers in the lower comb wire M2b are connected by a lower handle. The upper handle and the lower handle are led out to same PAD by wires.

Those skilled in the art may be aware that, limited to the schematic diagram, practically, the serpentine wires are in shape of elongated ⊥, wherein the length in the vertical direction is much larger than the length in the horizontal direction, that is, the length of the comb wires is much larger than the width of the handles. In a test piece, the length of ⊓ shape parts in the serpentine wire M1 is 1340 um in the vertical direction, and the width of entire test structure is 520 um, while the test structure contains a plurality of ⊥, shape parts in width.

FIG. 2 shows a test piece comprising six serpentine structures, which are disposed in parallel, wherein each of the serpentine wires circuitously extends in the first direction, comprising a number of ⊓ shape parts arranged in the first direction. With one of the serpentine wires as reference, the remaining serpentine wires comprised in the test piece shown in FIG. 2 may be seen as fingers in shape of ⊥ that are interspersed in the serpentine wire. Those skilled in the art may be aware that, limited to the schematic diagram, practically, the serpentine wires are in shape of elongated ⊥, wherein the length in the vertical direction is much larger than the length in the horizontal direction. In a test piece, the length of ⊥ shape parts in serpentine wire is 1340 um in the vertical direction, and the width of entire test structure is 520 um, while the test structure contains a plurality of ⊥ shape parts in width.

By the design of FIG. 1 or FIG. 2, metal wires are twisted back and forth over the substrate, in order to simulate the metal segments as long as possible over a same surface area.

As the semiconductor technology is increasingly advanced, the stability of the latter process is also increasingly strong, and the leakage of metal short circuit failure samples becomes very small. When a short circuit occurs between two adjacent metal wire segments as shown in FIG. 1 or FIG. 2, the conventional position analysis method cannot accurately locate the failure position.

FIG. 3A shows the test electrical data of the test piece shown in FIG. 1 or FIG. 2 made by the prior art. From FIG. 3A, only the short circuit between adjacent metal wires can be analyzed, while the position of the short circuit point cannot be positioned.

Figure 3B:
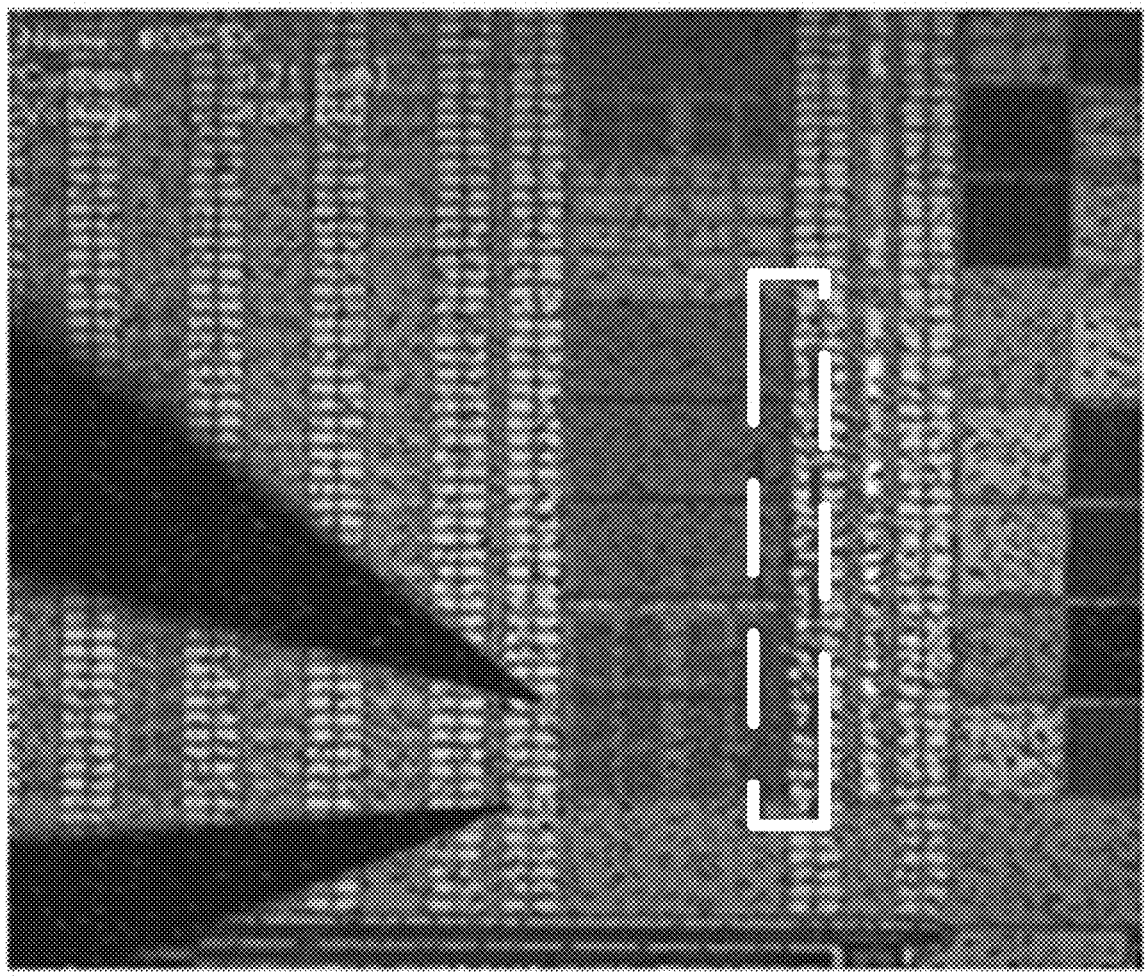
FIG. 3B shows the defect positioning result of the prior art OBIRCH.

FIG. 3B works according to the conventional OBIRCH. The method may position short circuit defects in the latter metal interconnect layer, but it often highlights a long hot spot containing the shorted position as the dashed box shown in FIG. 3B, rather than just highlighting the shorted position. Furthermore, based on the working principle of OBIRCH, the short circuit location cannot be further positioned, even in the case of the maximum precision (in small magnification) as shown in FIG. 3B.

Therefore, the present invention provides a positioning method based on the combination of resistance ratio, voltage contrast and dichotomy method, which may effectively approach the defect position of test piece structure as shown in FIG. 1 or FIG. 2.

Figure 4:
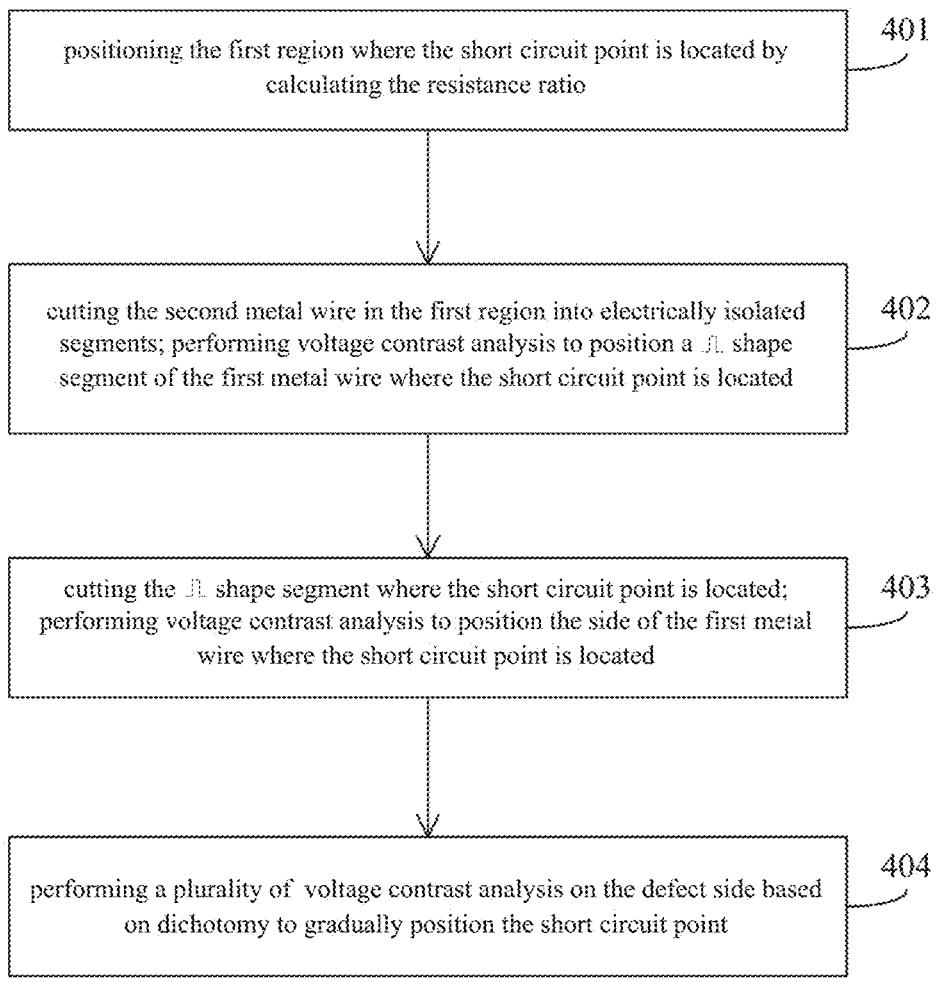
FIG. 4 shows the process diagram of the positioning method provided by the present invention.

As shown in FIG. 4, specifically, the method provided by the present invention at least comprises:

step 401: positioning the first region where the short circuit point is located by calculating the resistance ratio;

step 402: cutting the second metal wire in the first region into electrically isolated segments; performing voltage contrast analysis to position a ⊥ shape segment of the first metal wire where the short circuit point is located;

step 403: cutting the ⊥ shape segment where the short circuit point is located; performing voltage contrast analysis to position the side of the first metal wire where the short circuit point is located; and step 404: performing a plurality of voltage contrast analysis on the defect side based on dichotomy to gradually position the short circuit point.

Specific embodiments of the present invention are further described below in conjunction with the schematic diagrams shown in FIGS. 5A-8.

Figure 5A:
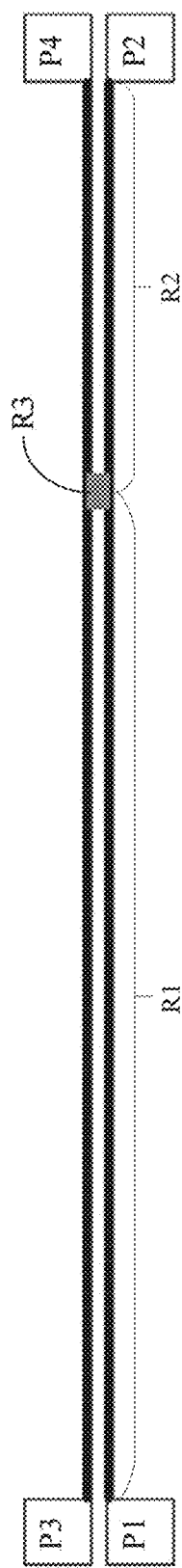
FIG. 5A shows the schematic diagram of the resistance ratio analysis of the present invention.

Firstly, refer to FIG. 5A, which illustrates the principle of performing resistance ratio analysis of the embodiment provided by the present invention. Two metal wires that are metal shorted may be simplified as shown in FIG. 5A, wherein PAD1 (P1) and PAD2 (P2) are connected to both ends of one metal wire, and PAD (P3) and PAD (P4) are connected to both ends of the other metal wire. A short circuit occurs between the two wires, wherein the resistance of the short circuit point is R3. The resistance between the short circuit point and one end of the metal wires (P1, P3) is R1, and the resistance between the short circuit point and the other end of the metal wires (P2, P4) is R2. By measuring the resistance (XΩ) between PAD1 and PAD2, the resistance (YΩ) between PAD2 and PAD3 and the resistance (ZΩ) between PAD2 and PAD4, according to the following formula $$\begin{cases} R1 + R2 = X \\ 2R1 + R3 = Y \\ 2R2 + R3 = Z \end{cases}$$

the corresponding R1, R2 and R3 may be calculated, and the short circuit position may be roughly positioned based on the resistance ratio of R1/R2.

Those skilled in the art may be aware that the resistance may be measured by conventional or upcoming resistance measuring tools and methods, which are not described herein.

Figure 5B:
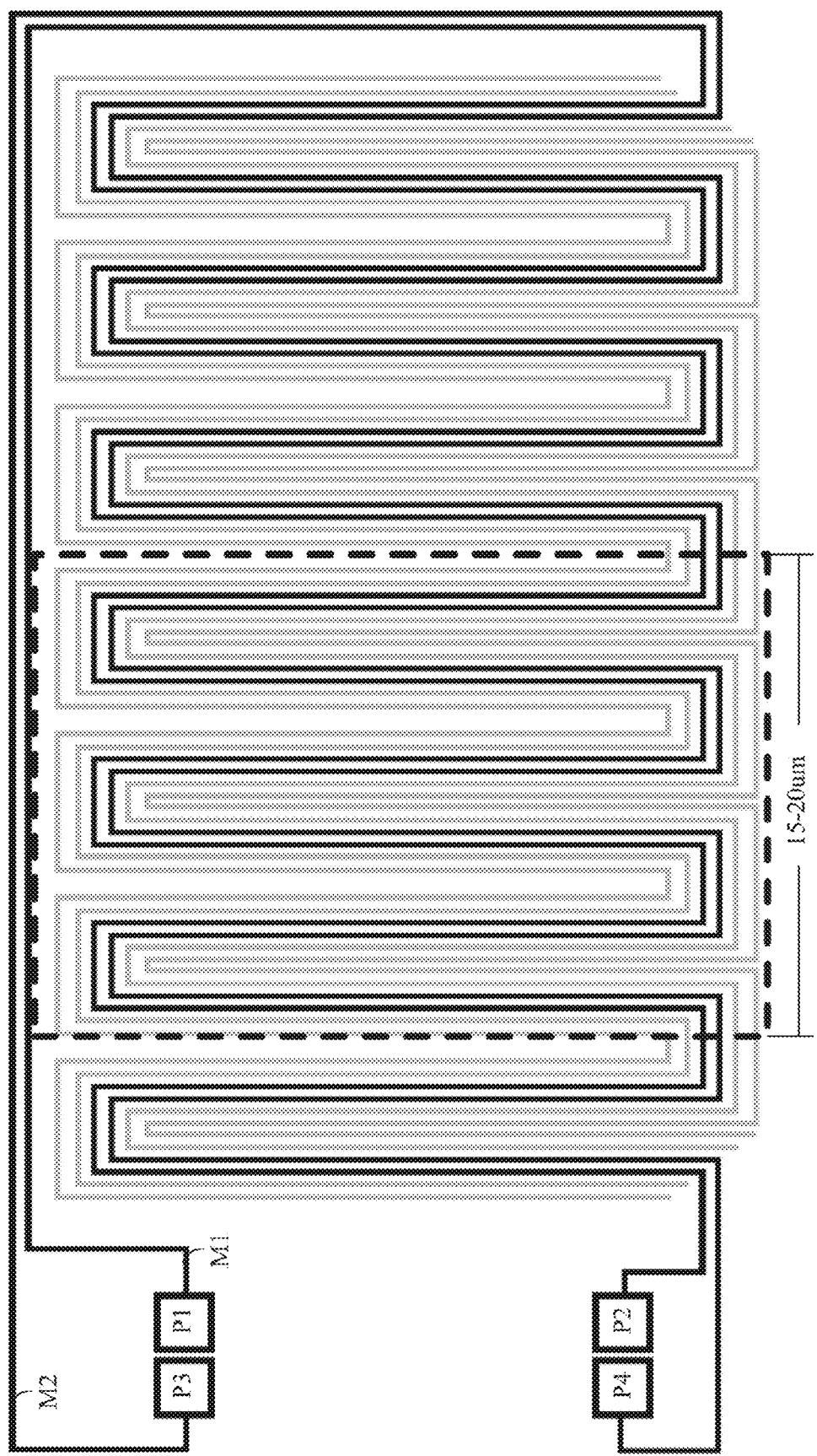
FIG. 5B shows the schematic diagram of positioning the first region by performing resistance ratio analysis of the present invention.

FIG. 5B shows a schematic diagram of positioning defect in the serpentine test piece shown in FIG. 2 by the method provided by the present invention. As shown in FIG. 5B, a metal short circuit occurs in the first metal wire M1 and the second metal wire M2. In the embodiment shown in FIG. 5B, the first metal wire M1 comprises a plurality of ⊐ shape parts in the first direction, and the second metal wire M2 comprises a plurality of fingers in shape of ⊐ in the first direction. According to the analysis of the resistance ratio, the region where the short circuit point is located may be positioned in a certain number of ⊐ shape parts from the circuitously extending ⊓ shape parts. Generally, the width of the first region (the dotted frame region in FIG. 5B) corresponding to the certain number of ⊐ shape parts is about 15-20 um. Those skilled in the art may appreciate that the dashed frame shown in FIG. 5B comprising three ⊐ shape parts is only an example, rather than a limitation of the number of ⊐ shape parts in the first region.

In the steps described above, by measuring the electric resistance between the first metal wire and the second metal wire, the area where the short circuit point is located may be reduced to the first region based on the resistance ratio.

Figure 6:
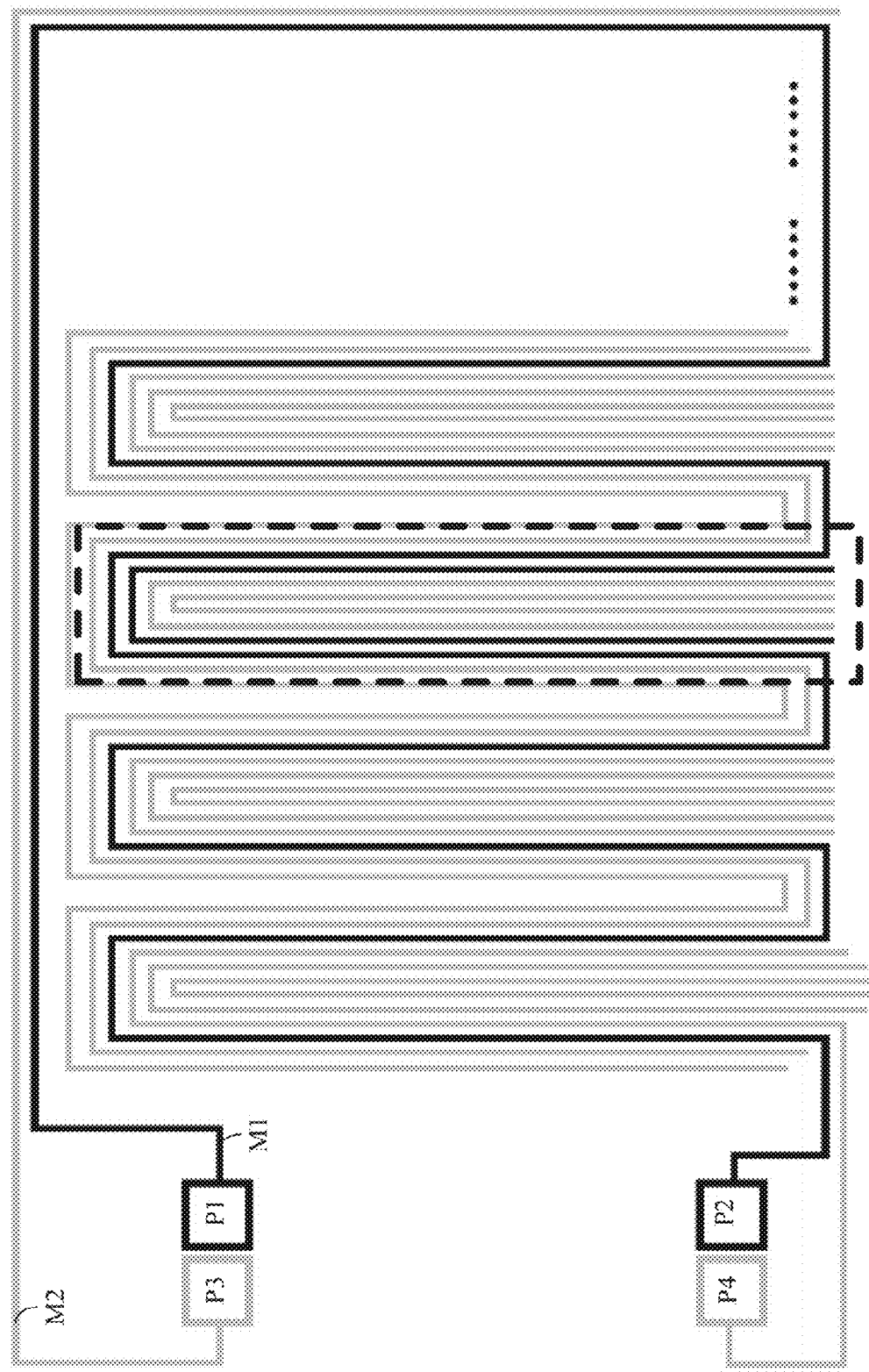
FIG. 6 shows the schematic diagram of further reducing the defect region of the present invention.

Further, in conjunction with FIG. 6, after positioning the first region where the short circuit point is located, the fingers of the second metal wire M2 in the first region are cut off from the second metal wire to electrically isolate the fingers of the second metal wire from each other. Preferably, the second metal wire in the first region is cut by focused ion beam (FIB) in the present invention.

It should be noted that the electrical isolation between the fingers means that the fingers are independent of each other and are not connected.

In the embodiment of a test piece having a plurality of serpentine structures as shown in FIG. 6, the fingers of the second metal wire M2 are in shape of ⊐. Therefore, cutting off the fingers of the second metal wire M2 in the first region from the second metal wire is to divide a complete serpentine wire into a plurality of independent ⊓ shape parts without connection.

In the embodiment of a test piece having a combination of serpentine structures and comb structures as shown in FIG. 1, the fingers of the second metal wire M2 are "linear", and the ends of the fingers are connected by a handle. Therefore, cutting off the fingers of the second metal wire M2 in the first region from the second metal wire is to cut the handle to separate a "comb-shaped" wire into a plurality of "linear" fingers that are independent to each other.

Further, in the embodiment shown in FIG. 1, the second metal wire M2 comprises an upper comb wire M2a and a lower comb wire M2b. When step 402 is performed, the upper handle may be cut, while the lower handle is kept intact, and a voltage contrast analysis is performed to see whether the short circuit point occurs between the serpentine wire M1 and the upper comb wire M2a. If the short circuit point does occur between the upper comb wire M2a and the serpentine wire M1, the ⊐ shape segment of first metal wire M1 (serpentine wire) where the short circuit point is located may be further positioned. If the short circuit point does not occur between the upper comb wire M2a and the serpentine wire M1, further cutting off the lower handle is required, and another voltage contrast analysis is to be performed to position the ⊐ shape segment of first metal wire M1 (serpentine wire) where the short circuit point is located.

Those skilled in the art may understand that in the steps described above, the upper handle and the lower handle may be cut at the same time to divide the upper comb wire M2a and the lower comb wire M2b into a plurality of independent "linear" fingers. Then, voltage contrast analysis may be performed to position the ⊐ shape segment of first metal wire M1 (serpentine wire) where the short circuit point is located.

Although the fingers of the second metal wire M2 in the first region have been cut away from the second metal wire, the first metal wire M1 is still a complete metal wire. Subsequently, a second sub-step of step 402 is performed to perform a voltage contrast analysis on the first metal wire and the fingers in the first region. Further, since the first metal wire M1 is intact, the first metal wire M1 may be grounded through the PAD1 and the PAD2, while the fingers of the second metal wire that are electrically isolated from each other may be floated, and a voltage contrast image may be acquired.

In an embodiment, the voltage contrast image mentioned above is an SEM voltage contrast image. In the voltage contrast image, metals at same potential have same voltage contrast, and hence have consistent image brightness. Since M1 and M2 are shorted in the first region, and the fingers of M2 are electrically isolated from each other in a floating state, the finger of M2 that is shorted with M1 may have a voltage contrast image consistent with M1. Therefore, as shown in the dotted frame in FIG. 6, a finger of M2 has the same voltage contrast as M1. Therefore, the short circuit point has been further reduced to a certain ⊐ shape part in the first region.

Since ⊐ shape part of M1 has two long sides, the positioning of the ⊐ shape part where the short circuit point is located still cannot meet the requirements of precise positioning. Therefore, further, in conjunction with FIGS. 7A-7D, step 403 is performed to gradually position the short circuit point between two adjacent metal wires by cutting the ⊐ shape part of M1 where the short circuit point is located to electrically isolate the two sides from each other.

It should be noted that the two sides electrically isolated from each other means that the two sides are independent from each other and are not connected.

In an embodiment, two metal wires plus the space between them are totally in width of about 0.1 um. Therefore, by performing step 403, the short circuit point can be further positioned to 0.1 um in the first direction.

Figure 7A:
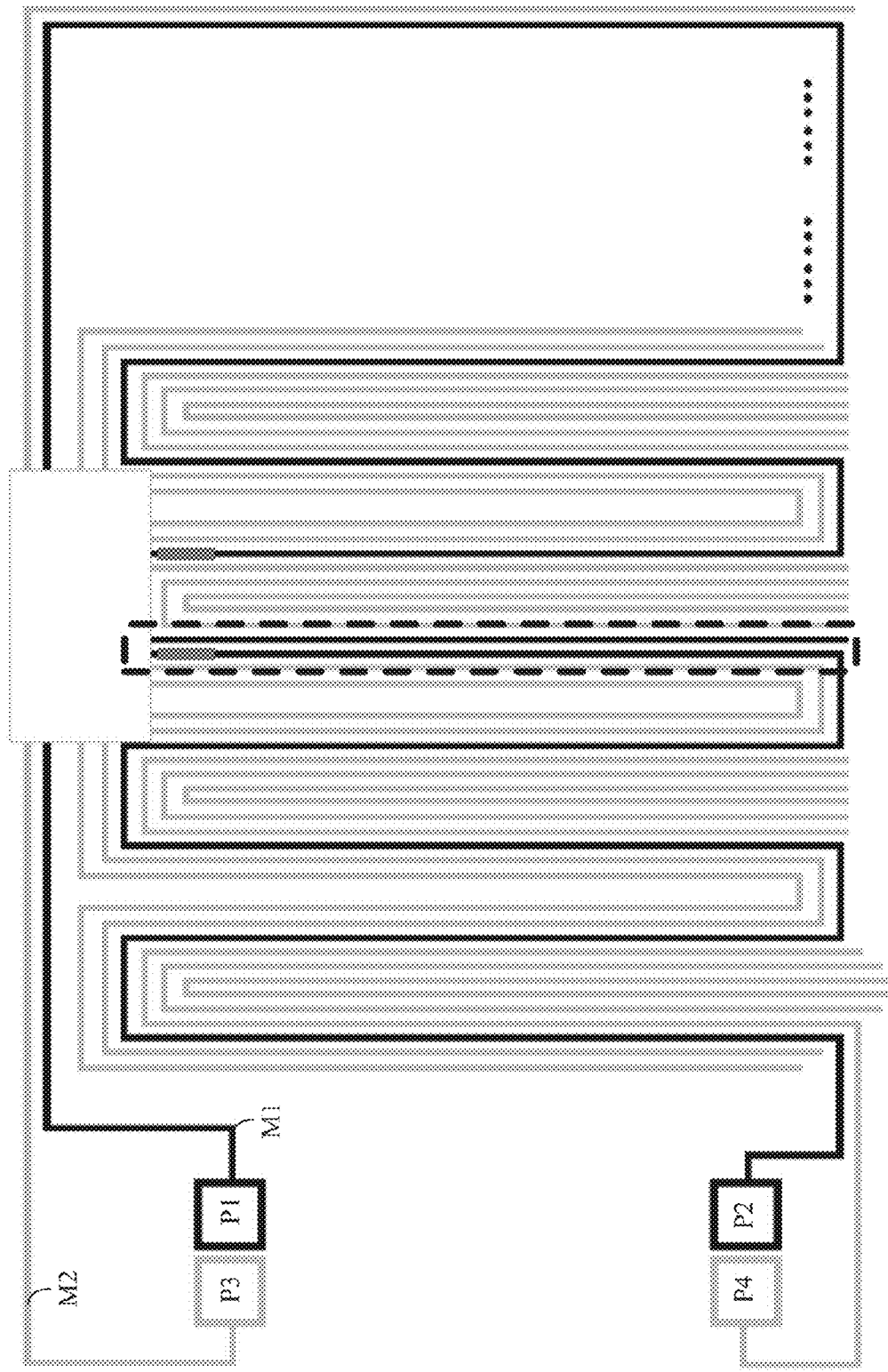
FIG. 7A shows an embodiment schematic diagram of further reducing the defect region of the present invention.

FIG. 7A shows a schematic diagram of an embodiment performing step 403 on serpentine test structures. In the structure shown in FIG. 7A, in addition to cutting the ⊐ shape part of the first metal wire (such as the light gray hollow frame shown in FIG. 7A) into left side and right side, the finger of the second metal wire (in shape of ⊐ in FIG. 7A) are also cut into left side and right side. Therefore, practically, voltage contrast analysis is performed on the four long sides to obtain the two sides that are shorted to each other.

Meanwhile, any one of the four long sides may be grounded by FIB (such as the dark gray solid frame shown in FIG. 7A) to obtain a voltage contrast image to analyze the side of short circuit point. For example, grounding the left M1 (or M2), if the left M1 and the left M2 have consistent voltage contrast, the short circuit point thereby occurs on the left sides, otherwise, the short circuit occurs on the right sides.

More preferably, as shown in FIG. 7A, one side leg on each of left and right sides may be grounded, thereby preventing erroneous operation and further positioning the region where the short circuit point is located. For example, the first metal wire M1 on the left and right sides is grounded. One side of the adjacent second metal wire M2 corresponding to the side where the short circuit point is located may have a voltage contrast consistent with the first metal wire.

Figure 7B:
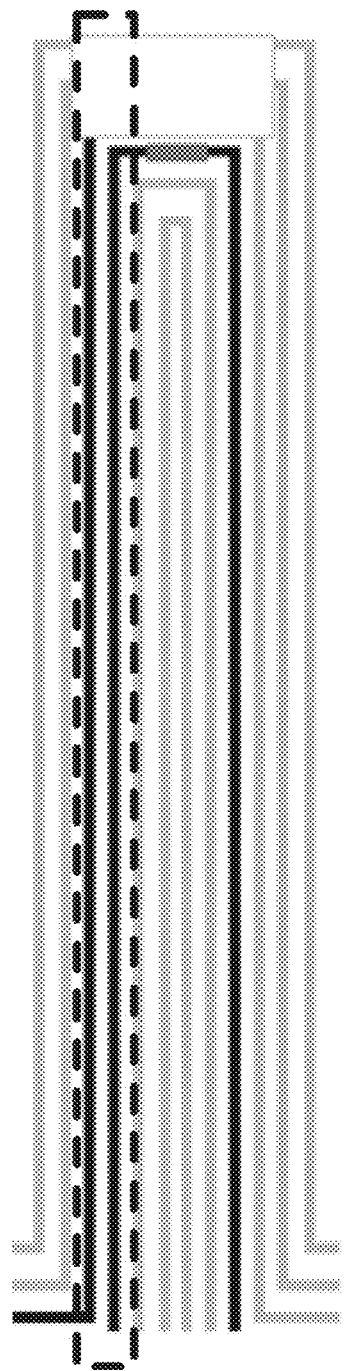
FIG. 7B shows another embodiment schematic diagram of further reducing the defect region of the present invention.

FIG. 7B shows a schematic diagram of another embodiment performing step 403 on serpentine test structures. In the structure shown in FIG. 7B, only ⊓ shape part of the first metal wire is cut (such as the light gray hollow frame shown in FIG. 7B), dividing the first metal wire M1 into left side and right side, while the second metal wire M2 in shape of ⊓ is not separated. Therefore, in the embodiment, as the dark gray solid frame shown in FIG. 7B, the second metal wire M2 in shape of ⊓ is grounded to obtain a voltage contrast image, wherein the side of the first metal wire M1 where the short circuit point is located has a voltage contrast consistent with the second metal wire.

Figure 7C:
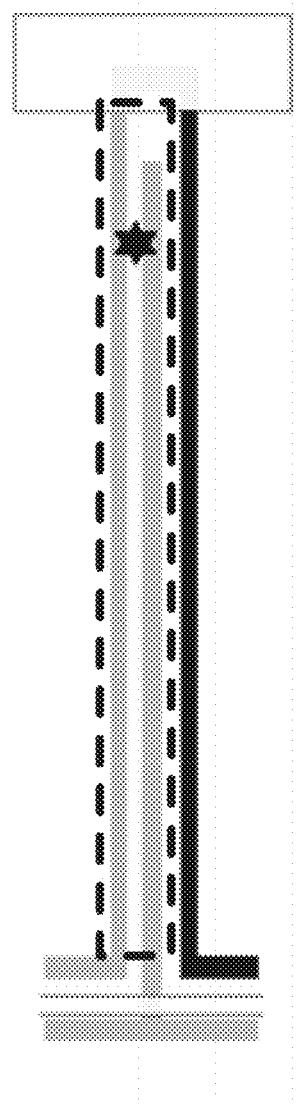
FIG. 7C shows another embodiment schematic diagram of further reducing the defect region of the present invention.
Figure 7D:
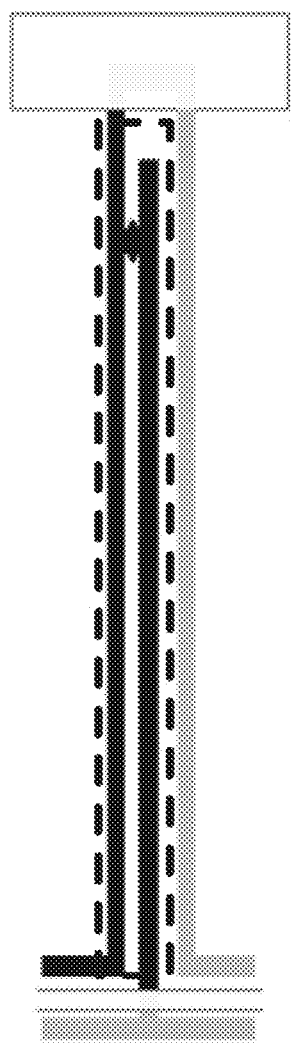
FIG. 7D shows another embodiment schematic diagram of further reducing the defect region of the present invention.

FIGS. 7C and 7D show schematic diagrams of two embodiments performing step 403 on the test structures comprising a combination of serpentine structures and comb structures. Since the second metal wire in the embodiment is in shape of comb, and the fingers of the second metal wire are linear shaped, the three long metal sides may be actually positioned after cutting the ⊓ shape part of the first metal wire (the light gray hollow frame in FIGS. 7C and 7D). By grounding any one of the three long metal sides, the long side where the short circuit point is located may be positioned by voltage contrast analysis.

Assuming that the short circuit point occurs between the left side M1 and M2, the right side M1 may be grounded as shown in FIG. 7C, the left side M1 and M2 may thereby have a consistent floating voltage contrast. The left side M1 (or M2) may either be grounded as shown in FIG. 7D, the left side M1 and M2 may thereby have a consistent grounded voltage contrast.

By the method provided above, the short circuit point may be positioned within a width of 0.1 um. As described above, although the short circuit point has been gradually approached to 0.1 um in the width direction, it is still impossible to be accurately positioned in the length direction. Therefore, after step 403, the method provided by the present invention further comprises performing step 404 to gradually approach the short circuit point in the length direction based on dichotomy principle.

Figure 8:
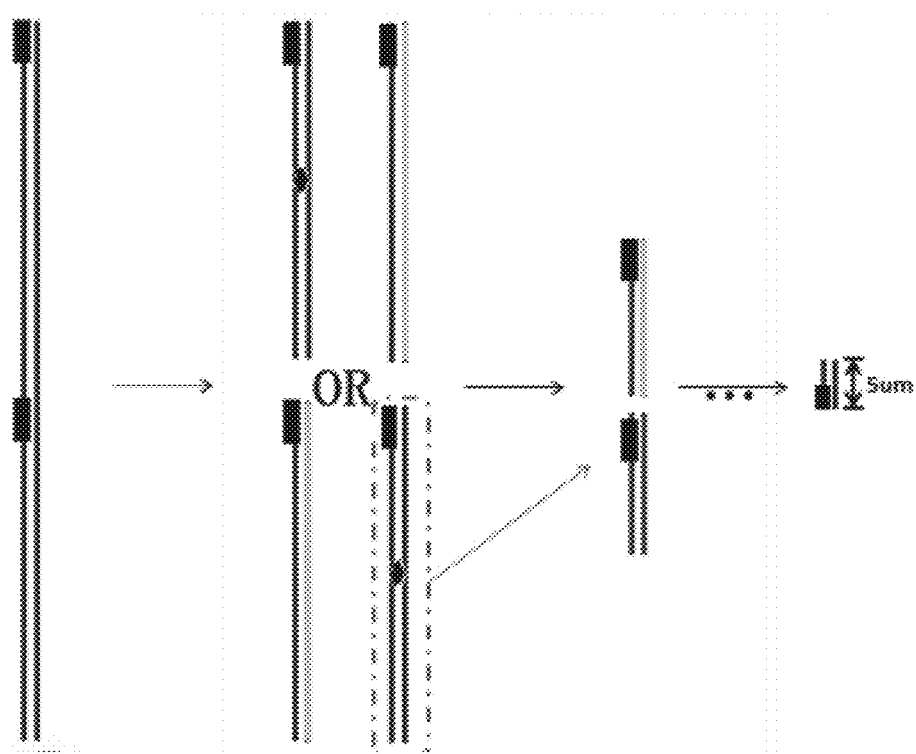
FIG. 8 shows the schematic diagram of gradually approaching the defect region based on dichotomy of the present invention.

Referring to FIG. 8, FIG. 8 is a schematic diagram showing the principle of dichotomy combined with voltage contrast analysis. Firstly, the long side where the short circuit point is located is equally divided. By grounding one of the metal wires in upper portion and one of the metal wires in lower portion, and obtaining a voltage contrast image, the short circuit point whether occurs in the upper or lower portion may be positioned. The upper or lower portion where the short circuit point is located may be performed with a plurality of voltage contrast analysis based on dichotomy until the short circuit point is gradually approached. In an embodiment, the short circuit point may be positioned in a region of 0.1×5 um by the method provided by the present invention.

Those skilled in the art may appreciate that the above mentioned "cut", "separate", etc. electrically isolating a part from a wire may be achieved by focused ion beam (FIB). The above mentioned "ground" may also be achieved by FIB.

The obtained voltage contrast image as described above may be observed by a scanning electron microscope (SEM). By positioning the short circuit point in a region of 0.1-5 um, the tester may zoom in on the region targetedly to accurately position the short circuit point.

Further, the region of the device may be analyzed by transmission electron microscopy (TEM) to determine the failure mechanism that causes the metal short circuit.

The method of the present invention may position the metal short circuit with nA level leakage, thereby finding the essential cause of failure, and greatly assisting in solving process problems and promoting the progress of research.

A practical example of positioning the short circuit in latter metal layer with nA level leakage is provided following in accordance with the method provided by the present invention. FIGS. 9-15B may be further referred.

Figure 9:
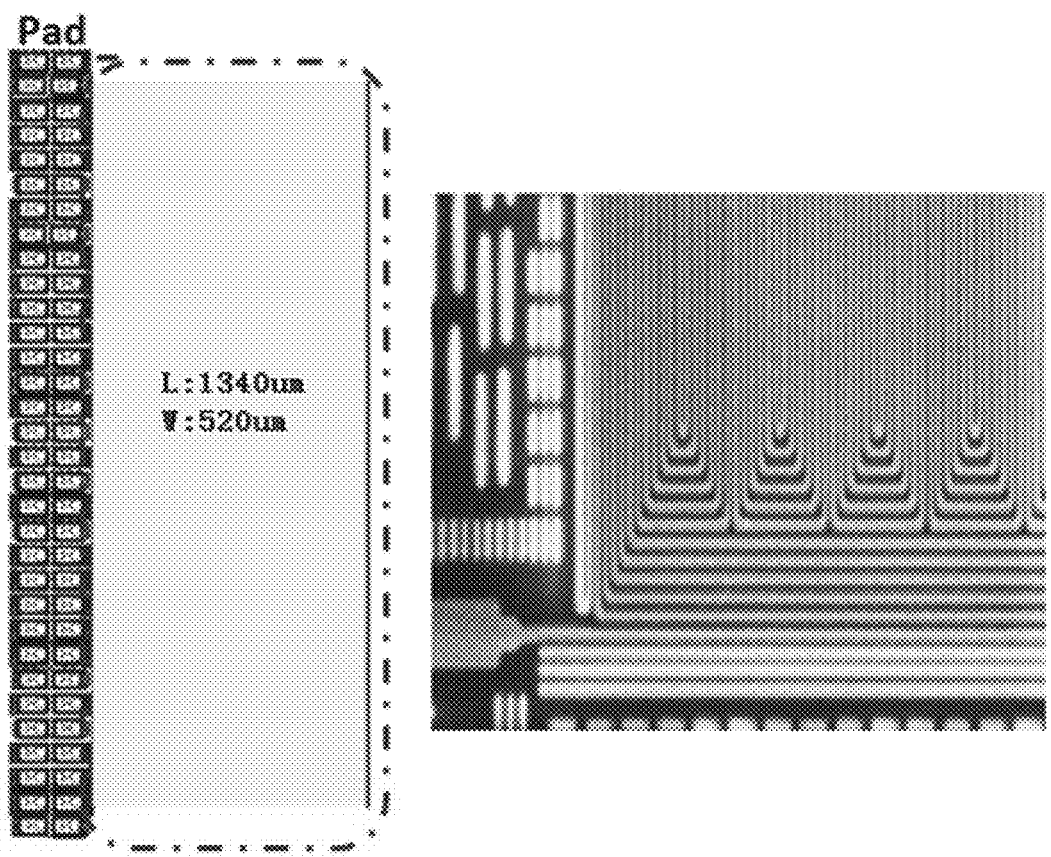
FIGS. 9-14 show the test piece observed by a scanning electron microscope (SEM) by the method provided by the present invention.

The left part of FIG. 9 shows a 28HKC PDF test structure, which monitors metal short circuit problems. The test structure is 1340 um long and 520 um wide. The right part of FIG. 9 shows the structure displayed by a SEM. The test monitoring metal short circuit shows that the leakage current is at the nA level. The short circuit is not positioned with the conventional positioning methods EMMI, OBIRCH and Thermal, while the positioning method provided by the present invention may accurately position the short circuit, and finally find the failure mechanism leading to the metal short circuit, providing a powerful help to new technology development.

Figure 10:
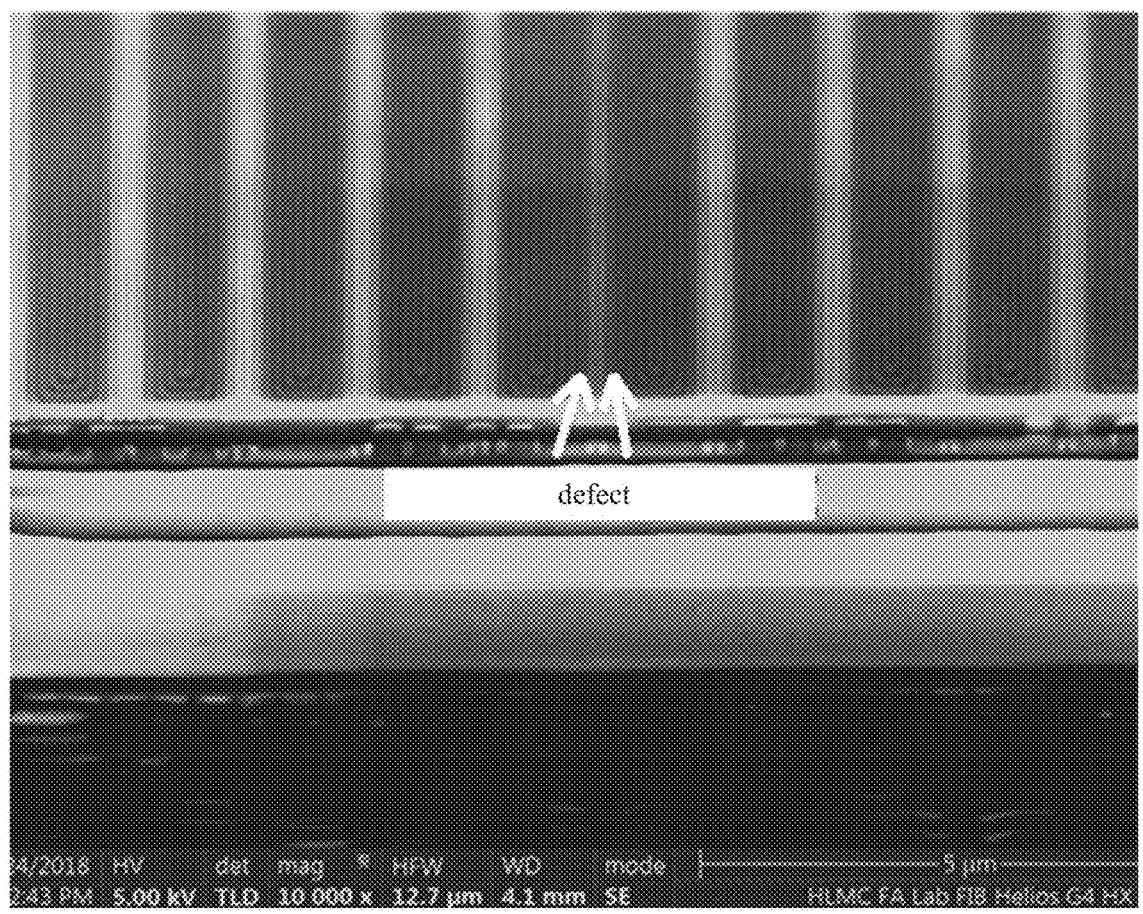

FIG. 10 shows that the metal short circuit position is shortened to about 15-20 um in width direction according to the resistance analysis method.

Figure 11:
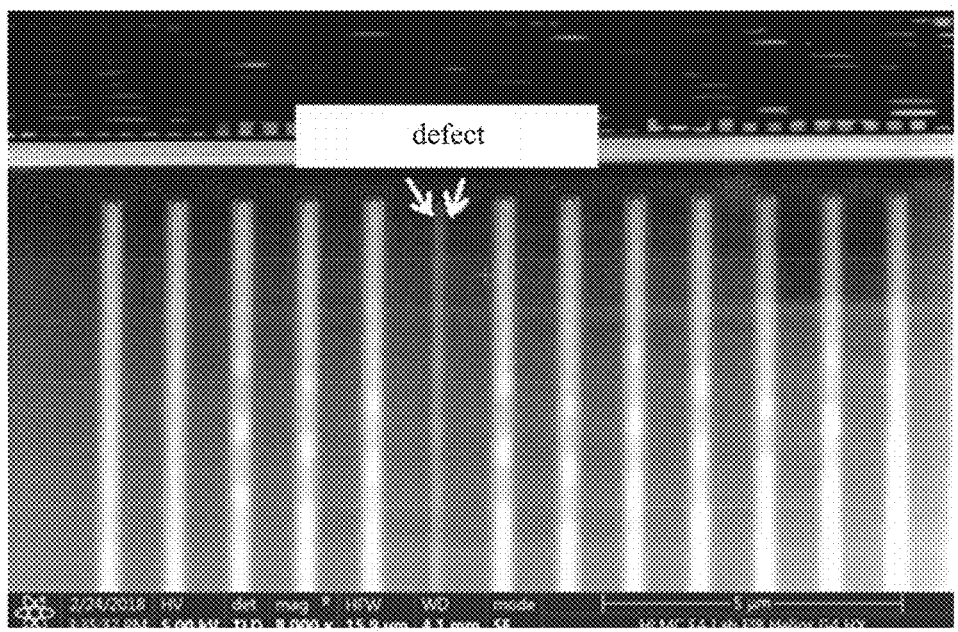

FIG. 11 illustrates that the metal short circuit position is further shortened to about 15-20 um after performing step 402.

Figure 12:
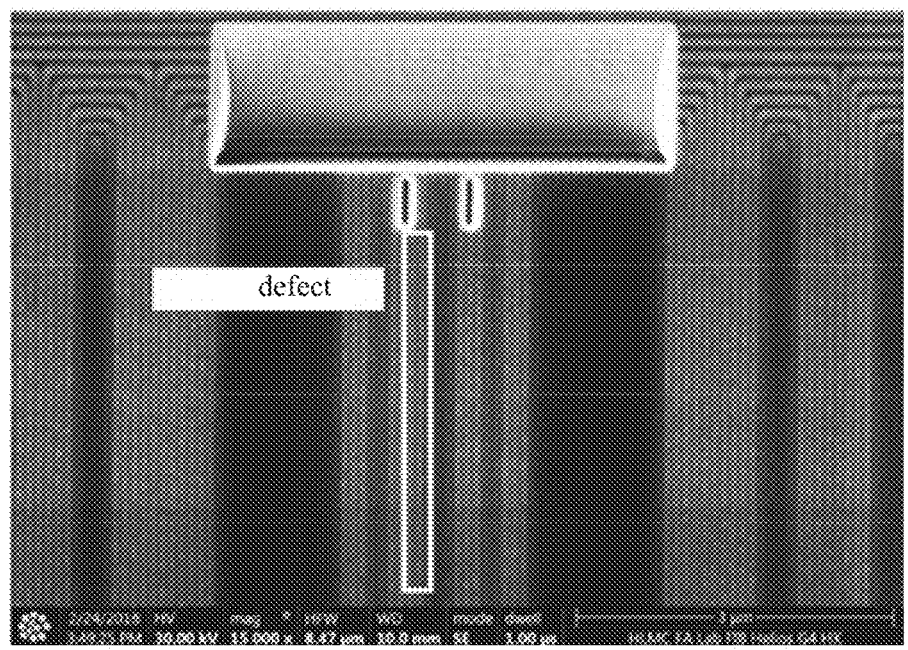

FIG. 12 shows that step 403 is performed to cut the grounded serpentine wire with FIB to shorten the metal short circuit position to 0.1 um in width direction.

Figure 13:
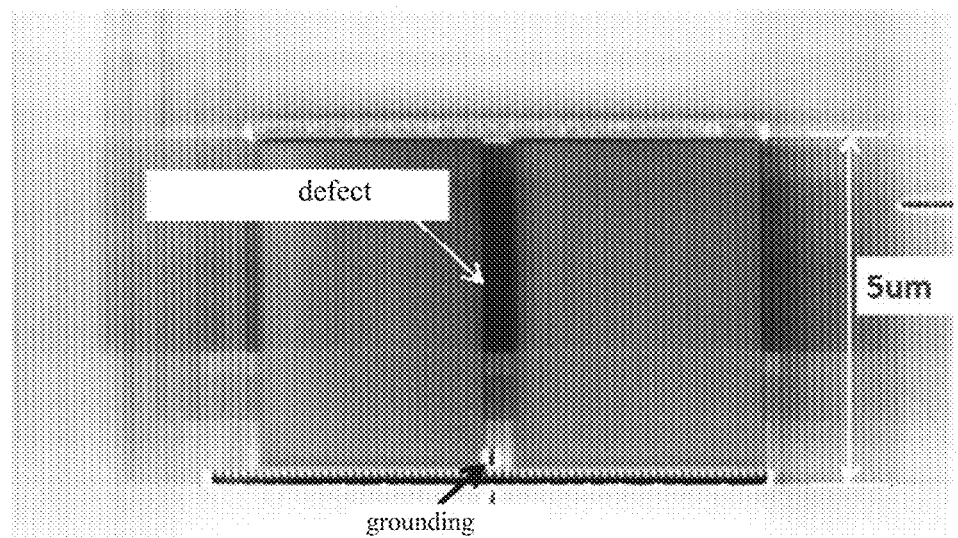

FIG. 13 shows that the metal short circuit position is shortened to 5 um in length direction based on repeatedly performing dichotomy.

Figure 14:
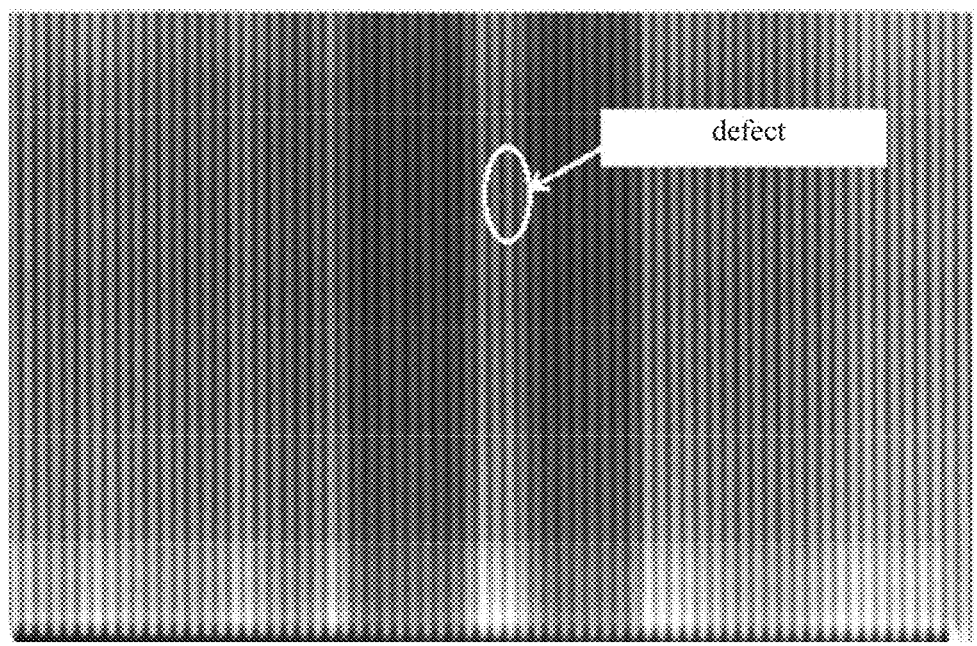

FIG. 14 shows a schematic diagram of magnifying the short circuit region by a SEM to see the short circuit point.

Figure 15A:
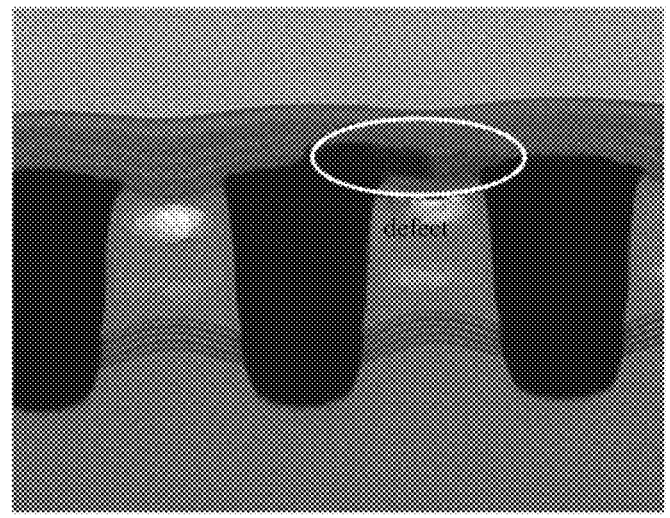
FIG. 15A and FIG. 15B show cross-sectional views of the defect observed by cross-sectional transmission electron microscope (TEM).
Figure 15B:
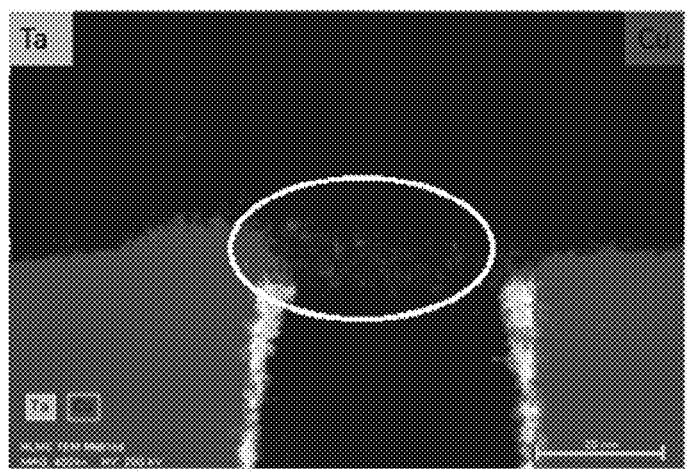

FIGS. 15A and 15B respectively show that the short circuit point is analyzed by TEM to further determine the failure mechanism.

The method of the present invention may position the metal short circuit with nA level leakage, thereby finding the essential cause of failure, and greatly assisting in solving process problems and promoting the progress of research.

The previous description of the disclosure is provided to enable any person skilled in the art to make or use the disclosure. Various modifications to the present disclosure will be obvious to those skilled in the art, and the general principles defined herein may be applied to other variations without departing from the spirit or scope of the disclosure.

Thus, the present disclosure is not intended to be limited to the examples and designs described herein, but is to be accorded the broadest scope of the principles and novel features disclosed herein.

What is claimed is:

1. A method for positioning short circuit failure, used to position a short circuit point between a first metal wire and a second metal wire, wherein the first metal wire circuitously extends in a first direction, comprising serpentine shape parts arranged in the first direction; the second metal wire comprises fingers arranged in the first direction, corresponding to the serpentine shape parts, wherein each finger is interspersed in the corresponding serpentine shape part; and the positioning method comprises:

measuring a resistance between the first metal wire and the second metal wire, and positioning a first region where the short circuit point is located by a resistance ratio, wherein the first region comprises a plurality of the serpentine shape parts of the first metal wire;

separating a plurality of corresponding fingers in the first region from the second metal wire to electrically isolate the plurality of fingers from each other;

performing a first voltage contrast analysis on the first metal wire and the plurality of fingers of the second metal wire, obtaining a first voltage contrast image, and positioning a serpentine shape part where the short circuit point is located based on the first voltage contrast image;

cutting the serpentine shape part where the short circuit point is located to electrically isolate the two sides of the serpentine shape part;

performing a second voltage contrast analysis on the two sides and the finger sandwiched therebetween, obtaining a second voltage contrast image, and positioning a defect side where the short circuit point is located based on the second voltage contrast image; and performing a plurality of following voltage contrast analysis on the defect side based on dichotomy, obtaining a plurality of following voltage contrast images, and positioning the defect side where the short circuit point is located based on the plurality of following voltage contrast images.

2. The method for positioning short circuit failure of claim 1, wherein the step of positioning the serpentine shape part where the short circuit point is located based on the first voltage contrast image further comprises:

grounding the first metal wire, floating the plurality of fingers of the second metal wire, performing the first voltage contrast analysis; and obtaining the first voltage contrast image of the first metal wire and the plurality of fingers, wherein the voltage contrast of the finger corresponding to the serpentine shape part having the short circuit point is different from a voltage contrast of remaining fingers.

3. The method for positioning short circuit failure of claim 1, wherein the second metal wire circuitously extends in the first direction, and the fingers are configured as serpentine structures.

4. The method for positioning short circuit failure of claim 3, wherein positioning the defect side where the short circuit point is located based on the second voltage contrast image further comprises: grounding the finger, floating the two sides, performing the second voltage contrast analysis; and obtaining the second voltage contrast image of the two sides and the finger sandwiched therebetween, wherein the defect side has the same voltage contrast as the finger.

5. The method for positioning short circuit failure of claim 3, wherein the step of cutting the serpentine shape part where the short circuit point is located further comprises: cutting the finger sandwiched by the serpentine shape part where the short circuit point is located to electrically isolate two lateral parts of the finger;

positioning the defect side where the short circuit point is located based on the second voltage contrast image further comprises: grounding the two sides, floating the two lateral parts of the finger, performing the second voltage contrast analysis; and obtaining the second voltage contrast image of the two sides and the two lateral parts of the finger, wherein one of the two lateral parts of the finger adjacent to the defect side has the same voltage contrast as the two sides.

6. The method for positioning short circuit failure of claim 1, wherein the second metal wire is comb-shaped in the first direction, comprising a handle extending in the first direction, wherein the handle connects the ends of the fingers, and the fingers are linear.

7. The method for positioning short circuit failure of claim 6, wherein performing the second voltage contrast analysis on the two sides and the finger sandwiched therebetween further comprises: grounding any one metal segment of the two sides and the finger sandwiched therebetween, floating the other two metal segments; and obtaining the second voltage contrast image of the two sides and the finger sandwiched therebetween, wherein the short circuit point is located between two adjacent metal segments having a same voltage contrast.

8. The method for positioning short circuit failure of claim 1, wherein performing a plurality of following voltage contrast analysis on the defect side based on dichotomy further comprises:

successively cutting the defect side and a defect segment of the second metal wire short circuited to the defect side by equal division to gradually reduce the region where the short circuit point is located; and after each equal division which cause the first metal wire and the second metal wire to be divided into two groups of metal wires comprising an upper portion and a lower portion, grounding one of the defect side and the defect segment of the second metal wire and floating the other in each of the two groups of metal wires, and obtaining a third voltage contrast image of the upper portion and a fourth voltage contrast image of the lower portion;

wherein the first metal wire and the second metal wire in one of the two groups of metal wires in which the short circuit point is located have a same voltage contrast.

9. The method for positioning short circuit failure of claim 1, wherein the step of positioning the first region further comprises:

respectively measuring the resistance X between the first end of the first metal wire and the second end of the first metal wire, the resistance Y between the first end of the first metal wire and the first end of the second metal wire, and the resistance Z between the second end of the first metal wire and the second end of the second metal wire; and according to the resistance X, the resistance Y and the resistance Z, calculating the resistance ratio of the resistance between the short circuit point and the first end of the first metal wire, and the resistance between the short circuit point and the second end of the first metal wire to position the first region.

10. The method for positioning short circuit failure method of claim 1, wherein the width of the first region corresponding to the plurality of serpentine shape parts in the first region is ranged in 15-20 um; and/or the short circuit point is identified within an area of 0.1 um×5 um based on dichotomy.

11. A method for testing short circuit failure, used to identify a location of a short circuit point between a first metal wire and a second metal wire, the first metal wire comprising a plurality of snake-shaped parts arranged in a first direction, the second metal wire comprising a plurality of fingers arranged in the first direction, the plurality of snake-shaped parts being configured as weaving between the plurality of fingers, each snake-shaped part corresponding to each finger, the method comprising:
    identifying a first region where the short circuit point is located based on a resistance ratio analysis, the first region comprising a first plurality of snake-shaped parts of the first metal wire corresponding to a first plurality of fingers of the second metal wire;
    cutting the second metal wire within the first region to electrically disconnect the first plurality of fingers of the second metal wire from each other in the first region;
    identifying a first snake-shaped part of the first metal wire where the short circuit point is located based on a first voltage contrast analysis, the first snake-shaped part comprising two sides corresponding to a first finger of the second metal wire;
    cutting the first snake-shaped part of the first metal wire where the short circuit point is located to electrically disconnect the two sides of the first snake-shaped part of the first metal wire;
    identifying a defect side of the first snake-shaped part where the short circuit point is located based on a second voltage contrast analysis, the defect side being one of the two sides of the first snake-shaped part; and
    performing a plurality of following voltage contrast analysis based on dichotomy to identify the short circuit point.

12. The method of claim 11, wherein identifying the first region where the short circuit point is located based on the resistance ratio analysis comprises:
    measuring a first resistance between a first end of the first metal wire and a second end of the first metal wire;
    measuring a second resistance between the first end of the first metal wire and a first end of the second metal wire;
    measuring a third resistance between the second end of the first metal wire and a second end of the second metal wire;
    calculating a fourth resistance between the first end of the first metal wire and the short circuit point based on values of the first resistance, the second resistance, and the third resistance;
    calculating a fifth resistance between the second end of the first metal wire and the short circuit point based on values of the first resistance, the second resistance, and the third resistance;
    calculating a first ratio of the fourth resistance to the fifth resistance; and
    identifying the first region based on the first ratio.

13. The method of claim 11, wherein identifying the first snake-shaped part of the first metal wire where the short circuit point is located based on the first voltage contrast analysis comprises:
    grounding the first metal wire and floating the first plurality of fingers of the second metal wire; and
    performing the first voltage contrast analysis to obtain a first voltage contrast image;
    wherein the first finger of the second metal wire is characterized by a first voltage contrast, the first voltage contrast of the first finger is different from voltage contrast of the remaining fingers in the first voltage contrast image.

14. The method of claim 11, wherein identifying the defect side of the first snake-shaped part where the short circuit point is located based on the second voltage contrast analysis comprises:
    grounding the first finger, floating the two sides of the first snake-shaped part; and
    performing the second voltage contrast analysis to obtain a second voltage contrast image;
    wherein the defect side of the first snake-shaped part is characterized by a second voltage contrast, a first voltage contrast of the first finger is the same as the second voltage contrast of the defect side of the first snake-shaped part in the second voltage contrast image.

15. The method of claim 11, wherein cutting the first snake-shaped part of the first metal wire further comprises:
    cutting the first finger of the second metal wire to electrically isolate two lateral parts of the first finger, the two lateral parts of the first finger comprising a first lateral part and a second lateral part, the first finger of the second metal wire being sandwiched between the two sides of the first snake-shaped part.

16. The method of claim 15, wherein identifying the defect side of the first snake-shaped part where the short circuit point is located based on the second voltage contrast analysis comprises:
    grounding the two sides of the first snake-shaped part and floating the two lateral parts of the first finger; and
    conducting the second voltage contrast analysis to obtain a second voltage contrast image;
    wherein the first lateral part of the first finger is adjacent to the defect side of the first snake-shaped part, the defect side of the first snake-shaped part is characterized by a second voltage contrast, the first lateral part of the first finger is characterized by a third voltage contrast, the third voltage contrast of the first lateral part is the same as the second voltage contrast of the defect side of the first snake-shaped part in the second voltage contrast image.

17. The method of claim 11, wherein the second metal wire is configured as a comb-shaped structure comprising a busbar configured as a handle-shaped structure extending in the first direction;
    wherein the busbar is electrically connected to the plurality of fingers of the second metal wire, the plurality of fingers is configured as a linear structure.

18. The method of claim 17, wherein identifying the defect side of the first snake-shaped part where the short circuit point is located based on the second voltage contrast analysis comprises:
    grounding one of three metal segments including the two sides of the first snake-shaped part and the first finger of the second metal wire, and floating the other two of the three metal segments; and
    performing the second voltage contrast analysis to obtain a second voltage contrast image;
    wherein the short circuit point is located between two adjacent metal segments having a same voltage contrast.

19. The method of claim 11, wherein performing the plurality of following voltage contrast analysis based on dichotomy to identify the short circuit point comprises:
- cutting the defect side of the first snake-shaped part and a defect segment of the second metal wire corresponding to the defect side into equal parts comprising an upper portion and a lower portion;
- performing a first following voltage contrast analysis in the upper portion, comprising:
  - grounding one of the two metal segments including the defect side of the first snake-shaped part and the defect segment of the second metal wire, and floating the other metal segment; and
- performing a second following voltage contrast analysis in the lower portion, comprising:
  - grounding one of the two metal segments including the defect side of the first snake-shaped part and the defect segment of the second metal wire, and floating the other metal segment;
- wherein the short circuit point is located in the upper portion, the first metal wire and the second metal wire within the upper portion have a same voltage contrast or the short circuit point is located in the lower portion, the first metal wire and the second metal wire within the lower portion have the same voltage contrast.

20. The method of claim 11, wherein a width of the first region where the short circuit point is located is 15-20 μm.

* * * * *